United States Patent
Croft et al.

(10) Patent No.: US 6,409,463 B1
(45) Date of Patent: Jun. 25, 2002

(54) APPARATUSES AND METHODS FOR ADJUSTING A SUBSTRATE CENTERING SYSTEM

(75) Inventors: Brett J. Croft; Michael Huston, both of Vancouver, WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 09/500,399

(22) Filed: Feb. 8, 2000

(51) Int. Cl.⁷ ............................................. B65G 49/07
(52) U.S. Cl. ...................... 414/936; 414/754; 414/783; 414/941; 438/973; 451/9
(58) Field of Search ................................ 414/754, 757, 414/780, 781, 783, 784, 935, 936, 941; 438/973; 451/9; 279/19, 3, 133

(56) References Cited

U.S. PATENT DOCUMENTS

| | | | |
|---|---|---|---|
| 4,057,902 A | | 11/1977 | Matsui |
| 4,295,276 A | | 10/1981 | Ellington, III |
| 4,358,843 A | * | 11/1982 | Rager .......................... 279/133 |
| 4,616,421 A | | 10/1986 | Forsén |
| 4,659,094 A | | 4/1987 | Leonov |
| 4,682,396 A | | 7/1987 | Leonov |
| 4,685,206 A | * | 8/1987 | Kobayashi et al. .......... 414/754 |
| 4,880,348 A | | 11/1989 | Baker |
| 5,669,752 A | * | 9/1997 | Moon .......................... 414/941 |
| 5,842,825 A | * | 12/1998 | Brooks ........................ 414/754 |
| 5,848,868 A | * | 12/1998 | Suzuki et al. ................ 414/757 |
| 5,851,041 A | * | 12/1998 | Anderson et al. ........... 414/941 |
| 6,068,441 A | * | 5/2000 | Raaijmakers et al. ....... 414/941 |
| 6,217,212 B1 | * | 4/2001 | Brenninger et al. ......... 414/936 |
| 6,273,484 B1 | * | 8/2001 | Peng ........................... 414/941 |

* cited by examiner

*Primary Examiner*—H. Grant Skaggs
(74) *Attorney, Agent, or Firm*—Alston & Bird LLP

(57) ABSTRACT

Apparatuses and methods for use in adjusting a substrate centering system to center a substrate on a rotatable chuck in a semiconductor processing machine, the chuck including at least one reference point. One apparatus comprises a plate configured to be placed on the chuck and at least one centering mark formed on the plate, wherein the at least one centering mark is configured so that it may be compared to the at least one reference point on the chuck to determine if the plate is centered. The plate often is at least partially transparent so that its position relative to the at least one reference point on the chuck may be seen.

16 Claims, 5 Drawing Sheets

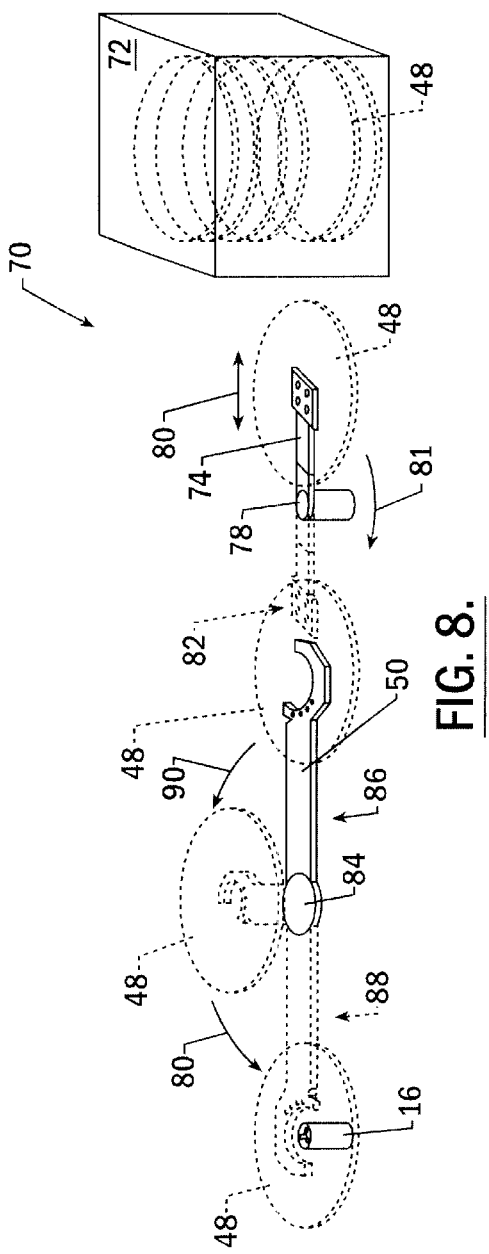
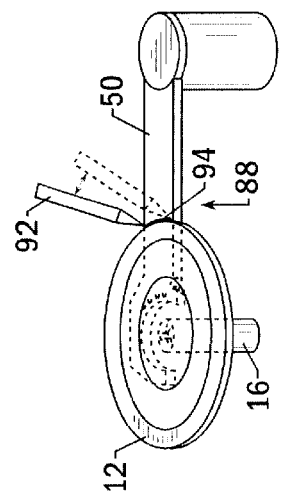
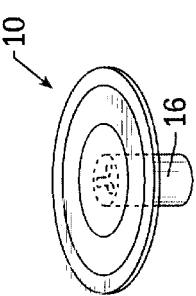

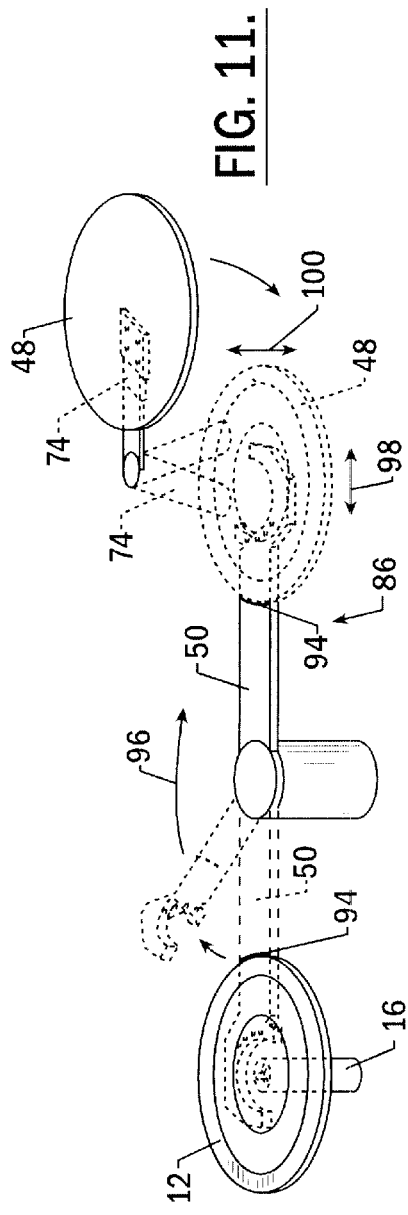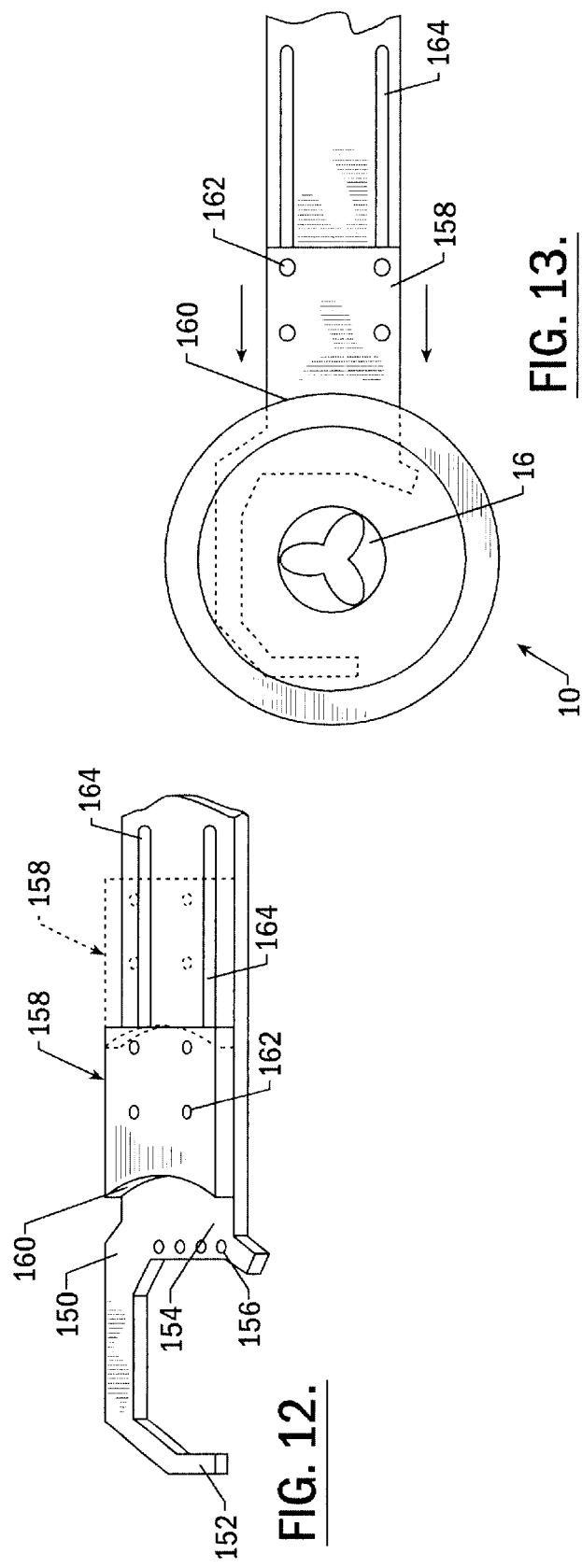

APPARATUSES AND METHODS FOR ADJUSTING A SUBSTRATE CENTERING SYSTEM

TECHNICAL FIELD

The present invention relates to apparatuses and methods for quickly setting an automatic substrate centering system in a semiconductor wafer processing machine to the correct position for centering substrates.

BACKGROUND

The production of semiconductor wafers and integrated circuits fabricated on such wafers involve many processing steps utilizing many different machines. As wafers are transferred onto each machine, care must be taken to ensure that each wafer is properly positioned on the machine so the wafer will be processed correctly. In particular, machines that use rotatable vacuum chucks to spin wafers require the wafers to be positioned with great precision. A rotatable vacuum chuck is a device that rotates a wafer, sometimes at very high speeds, while holding the wafer firmly in place with a vacuum. The chuck includes a surface on which a wafer may be placed, and a vacuum port extending through the surface. The surface is designed to provide an airtight seal when in contact with a wafer. Thus, when a wafer is placed on the surface, a vacuum can be created underneath the wafer, causing the wafer to be pressed firmly against the surface of the chuck by the air pressure differential across the wafer.

Rotatable vacuum chucks are used in many processes in the semiconductor industry. For instance, in the production of integrated circuits, they are used to apply photoresist to a wafer. In this process, a wafer is first mounted to a chuck. A solution of photoresist is then deposited on the surface of the wafer, either while the wafer is stationary or while it is spinning slowly. Once the photoresist solution has been applied, the wafer is spun at a much higher rate, typically 3,000 to 7,000 rpm, to remove excess photoresist from the wafer surface and to evaporate the solvent, drying the photoresist on the wafer in a thin, uniform layer.

A similar process is used in the production of semiconductor wafers to prepare a wafer for a polishing step. Toward the end of the semiconductor wafer production process, a polishing process is used to remove any damage to the wafer surfaces caused by prior production steps. The polishing process is generally a batch process, where several wafers are mounted to a single glass plate and polished at the same time. The wafers are attached to the glass plate with a thin layer of wax that is applied to the back of each wafer through a spin-coating process that uses a vacuum chuck. In some automated systems for mounting wafers to a glass polishing plate, the glass plate on which the wafers are mounted is rotated between individual mounting positions on a rotatable vacuum chuck, and the glass plate must be centered on the chuck. Rotatable vacuum chucks are also used in some drying processes, and in other machines such as some rapid anneal furnaces.

In each of the above processes, problems may arise if the wafer or glass plate is not positioned in a centered location on the chuck. For instance, in the wax spin-coating process, if the wafer is not centered on the chuck, the resulting wax coating may not have a uniform thickness across the surface of the wafer. Some parts of the wafer may not be coated with wax at all. If a wafer with such an uneven wax coating is mounted to a glass plate for polishing, the surface of the wafer may not be parallel to the surface of the polishing pad, and the polishing process may damage the wafer. At the very least, the polishing may introduce some thickness variation into the wafer. It is possible that the polishing may even chip or break the wafer, rendering the wafer unsuitable for commercial use. Similarly, in a photoresist coating process, spinning a solution of photoresist onto a non-centered wafer may result in the formation of an uneven layer of photoresist on the wafer. The thinner regions of photoresist may provide inadequate protection to the wafer from such processes as ion implantation, and thicker regions may not cure or develop properly. In either case, this may cause the wafer to be unsuitable for later processing.

Other problems may arise when a wafer, glass plate or other substrate is not correctly centered on a rotatable chuck. If a wafer is mounted too far off-center on a chuck, the moment of inertia of the spinning wafer may be sufficient to overcome the vacuum holding the wafer to the chuck. This may cause the wafer to fly off of the chuck during processing, resulting in damage or contamination to the wafer. Also, if a glass plate on which wafers are mounted for polishing is not correctly positioned on the mounting machine, a wafer may be incorrectly mounted to the glass plate. For proper polishing, the wafers should be mounted no closer than approximately 8 millimeters from the edge of the glass plate, because the surface of the plate may have some curvature within 8 millimeters of the plate edge. If a wafer is mounted in this curved region, the curvature may cause a gap to exist between the wafer and the plate. This gap may then cause the wafer to be damaged during the polishing process. If the glass plate is not correctly centered on the rotating chuck of the wafer-mounting machine, the edge of the glass plate will not be in the same position relative to the mechanical wafer-mounting arm for each wafer mounted on the plate. Thus, there is some danger that a wafer may be mounted too close to the edge of the plate, giving rise to these potential problems when the wafer is polished.

To ensure that a wafer is correctly positioned on a wafer processing apparatus, some machines have a substrate centering system. Several types of substrate centering systems are commonly used. One type, used with some rotatable vacuum chucks, consists of two or more plate-like pieces mounted to the machine in the same plane as a wafer positioned on the chuck. The pieces have half-moon shaped recesses formed in the edges adjacent the wafer, and are designed to converge upon the wafer so that the wafer is enclosed within the recesses and pushed to a centered position. Another system uses a four-point centering mechanism, in which four ram-like contacts converge on a wafer or other substrate at ninety-degree angles to each other to push the wafer into a centered position. Other processing machines may not have such a contact centering system, but instead may rely on the robotic mechanisms that transfer a substrate or wafer to the machine to place the substrate or wafer in a centered position.

All of above centering mechanisms rely on some mechanical mechanism to center a wafer. However, the mechanical mechanisms themselves must be adjusted to the correct centering position before they will center wafers correctly. The centering system adjustment process can be time consuming, often requiring 3–6 hours of machine down time to complete. Also, the adjustment process must be repeated whenever a machine is brought down for routine maintenance or somehow knocked out of adjustment.

To adjust a centering system, a wafer or substrate generally must first be manually centered on the rotatable chuck. This is typically done visually. First, an ordinary wafer or substrate is placed in an estimated centered position. Wafers generally have a diameter of 6 or 8 inches, and glass polishing plates are even larger. In contrast, the chuck surface typically has a diameter of around 1.5 inches. Visually inspecting the centering is difficult, as the wafer or substrate generally obscures the chuck. It is thus generally necessary to use a ruler to measure the distance from the edge of the chuck to the edge of the wafer all the way around the chuck. Next, the vacuum is turned on and the chuck is spun to check for any wobble indicating that the wafer or substrate is off-center. If wobble is detected, the process is repeated in a trial-and-error fashion until no wobble is detected in the spinning wafer or substrate. After the wafer or substrate has been centered, the centering system is brought into contact with the wafer or substrate, and is then set to place or push other wafers or substrates to the same position.

Because of the tedious nature of this trial-and-error process, wafer centering tools have been developed. Some of these centering tools have a flat bottom surface with a downwardly extending collar that is configured to precisely fit around the outside of the chuck so that the tool is automatically centered when it is placed on the chuck, as shown in U.S. Pat. No. 4,659,094. These tools also have an upper portion with a wafer-shaped extension around their diameter so that the wafer centering system may be set to the correct position by contacting it with the extension. This design has problems, however, in that it is not adaptable for use on chucks of different shapes or sizes. A different tool must be used for each wafer or substrate size and for each chuck. Thus, it would be desirable to have an improved method and apparatus for quickly setting a substrate centering system to center wafers or substrates in a semiconductor wafer processing machine that may be used on chucks of different shapes and sizes.

SUMMARY OF THE INVENTION

One aspect of the present invention provides an apparatus for use in adjusting a substrate centering system to center a substrate on a rotatable chuck in a semiconductor processing machine, the chuck including at least one reference point. The apparatus comprises a plate configured to be placed on the chuck and at least one centering mark formed on the plate, wherein the at least one centering mark is configured so that it may be compared to the at least one reference point on the chuck to determine if the plate is centered. The plate may be at least partially transparent so that its position relative to the at least one reference point on the chuck may be easily seen.

Another aspect of the present invention provides a method of adjusting a substrate centering system to center a substrate on a rotatable chuck in a semiconductor wafer processing machine, the chuck including at least one reference point. The method comprises (1) providing a centering tool to be centered on the chuck, wherein the centering tool includes at least one centering mark; (2) placing the centering tool on the chuck; (3) comparing the at least one reference point on the chuck to the at least one centering mark on the centering tool; (4) moving the centering tool to position the at least one centering mark in a predetermined position relative to the at least one reference point on the chuck so that the centering tool is centered on the chuck; and (5) using the centering tool to adjust the substrate centering system to center a substrate on the chuck.

Yet another aspect of the present invention comprises an apparatus for use in adjusting a substrate centering system to center a substrate on a rotatable chuck in a semiconductor wafer processing machine, the chuck having a wafer mounting surface with an aperture and the aperture having sides. The apparatus comprises a centering tool configured to be centered on the chuck, the centering tool having a lower surface; and a structure extending downwardly from the lower surface of the centering tool, wherein the structure is configured to fit within the aperture in the wafer mounting surface of the chuck to center the centering tool on the chuck.

Another aspect of the present invention provides a method of adjusting a robotic arm to place a wafer on a transfer arm in such a position that the transfer arm will place the wafer in a centered position on a chuck in a wafer processing machine, the chuck including at least one reference point. The method comprises (1) providing a transparent circular disk of the same diameter as the wafer to be transferred to the chuck, wherein the disk has a center, and wherein at least one circle is formed on the disk such that the center of the at least one circle is the center of the disk; (2) placing the disk on the chuck; (3) comparing the at least one reference point on the chuck to the at least one circle on the disk; (4) moving the disk to position the at least one circle in a predetermined position relative to the at least one reference point on the chuck so that the disk is centered on the chuck; (5) positioning the transfer arm in a first home position in contact with the disk on the chuck so that the disk is in an optimized location on the transfer arm; (6) marking the optimized location of the disk on the transfer arm; (7) moving the transfer arm to a second home position adjacent the robotic arm; and (8) adjusting the robotic arm so that the robotic arm transfers a wafer to the transfer arm at the marked optimized location on the transfer arm.

BRIEF DESCRIPTION OF THE DRAWINGS

FIG. 8 is a schematic diagram of an automated system for transferring substrates from a substrate cassette to a rotatable vacuum chuck.

FIG. 9 is an isometric view of a centering tool according to an embodiment of the present invention centered on a rotatable vacuum chuck.

FIG. 10 is an isometric view of a first embodiment of a marking device and mark made on an optimized location of a robotic transfer arm according to the present invention.

FIG. 11 is an isometric schematic view of a second robotic transfer arm positioned to be adjusted to transfer a substrate onto the first robotic transfer arm of FIG. 10 at the marked location.

FIG. 12 is an isometric view of a marking member according to an embodiment of the present invention.

FIG. 13 is a top plan view showing the marking member of FIG. 12 in contact with a substrate.

DETAILED DESCRIPTION AND BEST MODE FOR CARRYING OUT THE INVENTION

Figure 1:
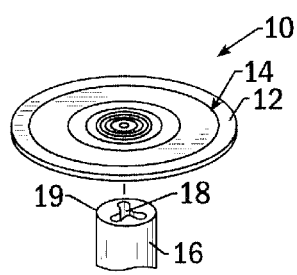
FIG. 1 is an isometric view of a centering tool according to a first embodiment of the present invention positioned above a rotatable vacuum chuck.

The present invention provides apparatuses and methods for adjusting a substrate centering system to center substrates on a semiconductor wafer processing machine. FIG. 1 shows generally at 10 a substrate centering tool according to a first embodiment of the present invention positioned above a rotatable vacuum chuck 16. Centering tool 10 includes a plate 12 with at least one centering mark 14. Plate 12 is at least partially transparent, and often completely transparent, so that centering mark 14 can be compared with some reference point on the top of vacuum chuck 16 by looking through plate 12 when plate 12 is positioned on chuck 16. Suitable reference points may include a vacuum port 18, or the edge 19 of chuck 16. Plate 12 can then be moved on chuck 16 to position centering mark 14 in a predetermined position relative to chuck 16, thereby centering tool 10 on chuck 16.

Because plate 12 is configured to be used for adjusting a substrate centering system, plate 12 must be at least partially dimensioned to correspond to the dimensions of the substrate. For a round substrate such as a semiconductor wafer, plate 12 may be an elongate member with a length that corresponds to the radius or diameter of the wafer, or it may a wedge-shaped or semicircular piece that has a curved edge with the same radius as the wafer. In a preferred embodiment, plate 12 is circular and has the same diameter as the substrate to be centered, as shown in FIG. 1. For example, semiconductor wafers are commonly manufactured with diameters of 6 inches and 8 inches. Thus, a centering tool used to set a machine to center wafers of one of these sizes would include a plate of one of these diameters. Though plate 12 may be made to any shape, plate 12 is preferably flat. Use of a flat plate 12 offers several advantages over other shapes. For example, it is easier and cheaper to manufacture plate 12 to be flat. A flat piece may be simply cut from sheets of a material such as plastic, while a more complex shape may require the use of more expensive molding or machining processes. More importantly, a flat plate 12 will not distort the image of the chuck when the chuck is viewed through plate 12, making the centering process easier. Plate 12 can be made from any suitable material that allows a chuck to be seen through plate 12. A preferred material is polycarbonate plastic due to its transparency, high impact strength, and resistance to thermal deformation and combustion.

Centering mark 14 is used as a reference to which the position of plate 12 on chuck 16 may be determined. Centering mark 14 may be any suitable mark, but preferably has radial symmetry with respect to the center of plate 12. This allows a central reference point on chuck 16, such as the center of vacuum port 18, to be compared with mark 14 around the entire circumference of mark 14. If all points on mark 14 are equidistant from the center of vacuum port 18, then centering tool 10 is centered. Examples of a suitable mark 14 include a circle with a diameter similar to that of the mark 14, or a single point located in the center of plate 12. A combination of these may be used for mark 14 as well. If chuck 16 is formed of a rigid material that does not deform when a vacuum is applied to hold centering tool 10 to the chuck, a circle with the exact same circumference as the edge 19 of chuck 16 may be for mark 14. An example would be a quartz chuck, commonly found in rapid anneal furnaces. However, most ordinary vacuum chucks are not suitable for use with this type of mark 14. This is because they are generally made from rubberized materials, which tend to deform when a vacuum is applied to hold a wafer or centering tool 10 to the chuck.

Figure 2:
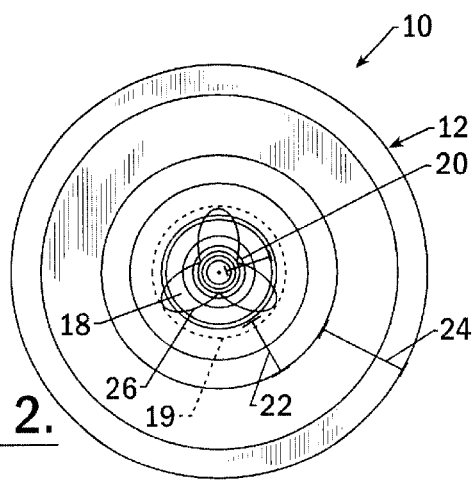
FIG. 2 is a top plan view of the centering tool of FIG. 1 positioned in a centered position on a rotatable vacuum chuck.

An example of a preferred centering mark 14 comprising a plurality of concentric circles arranged around the center of plate 12 is shown in FIG. 2. This arrangement offers the advantage that centering tool 10 may be used on chucks of various sizes or with deformable surfaces. This also offers the advantage that more than one reference point on chuck 16 may be compared to more than one circle on centering tool 10, increasing the accuracy and ease with which centering tool 10 may be centered. FIG. 2 illustrates an example of this. In FIG. 2, centering mark 14 has three different regions of circles. The innermost region of circles is indicated at 20. These circles are spaced the closest together. This is because many chucks have small diameters and fit entirely within this region, and also because most chucks have a radially symmetric vacuum port to which these circles may be compared. Thus, the greatest number of potential reference points is found within this region. In a preferred embodiment, inner region 20 consists of four circles, each spaced 5 millimeters from adjacent circles. This gives inner region 20 a total diameter of 40 millimeters, a common diameter for chucks. Mark 14 also includes middle region 22 and outer region 24. In a preferred embodiment, middle region 22 includes two lines spaced 10 millimeters apart from each other and adjacent lines, and outer region 24, extending from the edge of region 22 to the outer edge of plate 12, has lines spaced 20 millimeters apart. The inclusion of circles in regions 20 and 22 allows centering tool 10 to be used on machines with larger chucks. The lines are set farther apart in regions 20 and 22 to preserve a clear view of chuck 16 through plate 12. Centering mark 14 may be made on plate 12 in any suitable fashion, such as by printing on the surface of plate 12 or molding into plate 12 during the manufacturing process. However, the preferred method of forming mark 14 in plate 12 is to scribe or machine mark 14 into the upper surface of plate 12 after forming plate 12.

Figure 3:
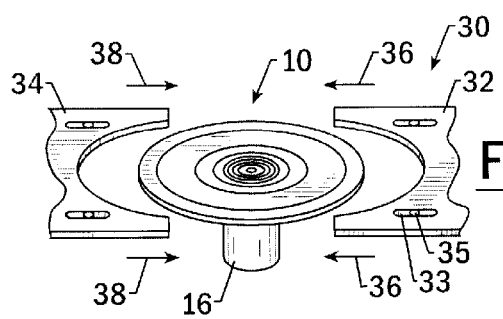
FIG. 3 is an isometric view of a centering system in contact with the centering tool of FIG. 1 after the centering tool has been centered on a rotatable vacuum chuck.

Centering tool 10 may be used to adjust any substrate centering mechanism to center substrates on a chuck or other apparatus. FIGS. 3–7 illustrate how centering tool 10 is used to center a typical substrate centering system. FIG. 3 shows centering tool 10 positioned on chuck 16. A substrate centering system is indicated generally at 30, and comprises two opposing pieces 32 and 34 with half-moon shaped recesses corresponding to the shape of a substrate. Plates 32 and 34 are attached to other mechanical parts of substrate centering system 30 by some adjustable mechanism, such as with a plurality of bolts 35 extending through slots 33. When a substrate is placed on chuck 16, plates 32 and 34 are moved inwards toward the substrate to a centering position, capturing the substrate within the recesses of plates 32 and 34 and pushing the substrate into a centered position on chuck 16. After centering the substrate, plates 32 and 34 move out of the centering position and into a loading position, waiting for the next wafer to be mounted to the chuck before repeating the centering routine.

Figure 4:
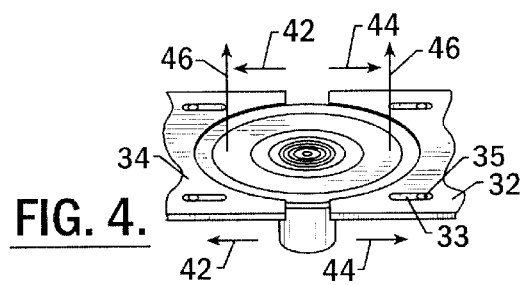
FIG. 4 is an isometric view of the adjustment of the centering system of FIG. 3 to center wafers in the position of the centering tool of FIG. 1.

Centering tool 10 is used to adjust substrate centering system 30 as follows. First, centering tool 10 is centered on chuck 16 following the visual procedure described above. After positioning centering tool 10 in a centered position, the vacuum of chuck 16 may be turned on and centering tool 10 spun on the chuck to check for any wobble indicating that centering tool 10 is off center. Next, plates 32 and 34 are moved inward toward the substrate, indicated by arrows 36 and 38 in FIG. 3, so that plates 32 and 34 are positioned close to centering tool 10 as shown in FIG. 4. Once plates 32 and 34 have been brought into proximity with centering tool 10, the substrate centering system is set to center substrates to this position. The method used to set substrate centering system 30 will differ depending on the type of system used. For instance, some substrate centering systems are manually adjustable, such as that shown in FIGS. 3–7. In this case, plates 32 and 34 may be adjusted by first loosening bolts 35, then sliding plates 32 and 34 into contact with centering tool 10, and then tightening bolts 35 to hold plates 32 and 34 in the correct position. After setting, plates 32 and 34 will return to this position each time substrate centering system 30 is activated. Other substrate centering systems may be computer controlled. In this case, plates 32 and 34 may be brought into position by manually positioning plates 32 and 34 to the correct centering position, and then setting the positions of plates 32 and 34 into memory so that plates 32 and 34 will return to the same position. Once the centering positions of plates 32 and 34 have been set, plates 32 and 34 are moved to the loading position, indicated by arrows 42 and 44, to wait for a wafer or substrate to be mounted to the chuck. Note that no matter what type of setting mechanism is used, it is important that centering tool 10 have the same radius as the wafers to be centered so that plates 32 and 34 can be set to move to the correct position to center the wafers. The use of substrate centering tool 10 for this adjustment process greatly increases the ease at which the centering system is adjusted. Where the adjustment process typically took 3–6 hours when using an ordinary wafer to adjust the system, it can be completed in ½ hour or less with centering tool 10 because of the ease with which centering tool 10 is centered on a chuck.

Figure 5:
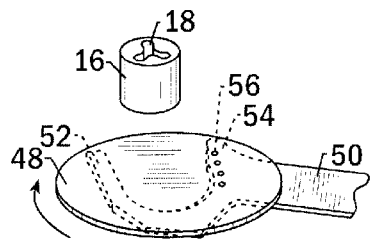
FIG. 5 is an isometric view of a mechanical transfer arm holding a substrate for transfer onto a rotatable vacuum chuck.
Figure 6:
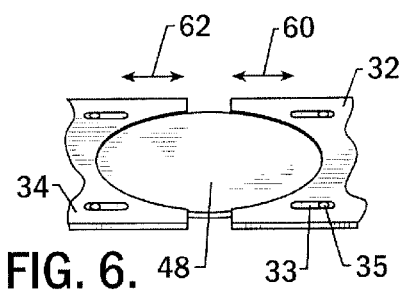
FIG. 6 is an isometric view of the adjusted centering system of FIG. 4 in contact with the substrate of FIG. 5.
Figure 7:
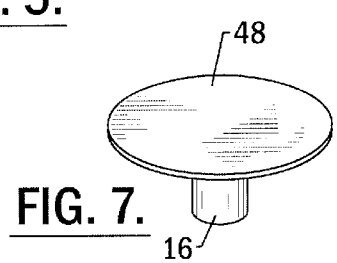
FIG. 7 is an isometric view of the substrate of FIG. 5 positioned on a rotatable vacuum chuck after the substrate has been centered with the adjusted centering system of FIG. 4.

FIGS. 5–7 illustrate how the adjusted substrate centering system centers a substrate. FIG. 5 shows a robotic transfer arm 50 transferring a substrate, in this case a semiconductor wafer 48, onto chuck 16. Transfer arm 50 includes two prongs 52 and 54, which extend around chuck 16 to facilitate the loading and unloading of wafer 48 to and from chuck 16. Transfer arm 50 also includes vacuum holes 56 for holding wafer 48 securely to transfer arm 50. Once transfer arm 50 moves wafer 48 into location over chuck 16, transfer arm 50 moves down to position wafer 48 on chuck 16. Then, the vacuum at transfer arm vacuum holes 56 is deactivated so that wafer 48 is deposited on chuck 16. Next, as illustrated in FIG. 6 at 60 and 62, plates 32 and 34 move to their centering positions, pushing wafer 48 into a centered position on chuck 16. Then, a vacuum may be applied in vacuum port 18 to hold wafer 48 to chuck 16. Finally, plates 32 and 34 move back to the loading positions, leaving wafer 48 centered on chuck 16, as shown in FIG. 7.

Not all wafer processing machines have mechanisms for centering a substrate on a chuck. In this case, the robotic transfer arm that transfers wafers to the chuck must be set so that it positions wafers at precisely the right spot on the chuck. FIG. 8 illustrates at 70 a typical wafer transfer process. First, a wafer 48 is removed from a wafer cassette 72 by a first robotic arm 74. Then, wafer 48 is transferred to a second robotic arm, shown here as transfer arm 50, and then moved to chuck 16 by transfer arm 50. First robotic arm includes a vacuum pad 76 for holding wafers during transfer. The length of first robotic arm 74 is variable, as indicated at 80, so that first robotic arm 74 can remove wafers from cassette 72. The vertical and radial positions of first robotic arm 74 may be varied at first robotic arm base 78. After removing wafer 48 from cassette 72, first robotic arm 74 moves to a home position 82 adjacent transfer arm 50, as indicated by arrow 81.

Transfer arm 50 typically has two home positions. A first home position 86 is adjacent first robotic arm 74 for receiving wafers from robotic arm 74. A second home position 88 is adjacent chuck 16 for removing or mounting wafers to chuck 16. The operation of transfer arm 50 is as follows. First, a wafer is positioned on transfer arm 50 by first robotic arm 74 while transfer arm 50 is at first home position 86. Transfer arm 50 then moves from first home position 86 to second home position 88, as shown by arrows 90. At second home position 88, wafer 48 is placed on chuck 16 by transfer arm 50. For transfer arm 50 to place wafer 48 on chuck 16 in a precisely centered position, first robotic arm 74 must be set to position wafer 48 on transfer arm 50 at precisely the right location.

First robotic arm 74 is set according to the following process, illustrated in FIGS. 9–11. First, as shown in FIG. 9, centering tool 10 is centered on chuck 16 using the above-described process. Next, as shown in FIG. 10, transfer arm 50 is moved to its second home position 88 adjacent centering tool 10 on chuck 16. A mark 94 corresponding to the edge of centering tool 10 is then made on transfer arm 50 with a suitable marking device 92, such as a pen. It is important that centering tool 10 have at least a portion with the same shape and radius as wafer 48, as mark 94 must correspond exactly to the shape and radius of wafer 48. The marking device should be chosen to introduce as little contamination into the processing environment as possible. After mark 94 is made, transfer arm 50 is moved to first home position 86, as indicated by arrows 96 in FIG. 11. Then, robotic arm 74 brings a wafer 48 into position over transfer arm 50. The position of first robotic arm 74 is carefully adjusted along the axes indicated by arrows 98 and 100 to bring wafer 48 into precise alignment with mark 94. Once first robotic arm 74 is positioned to deposit wafer 48 precisely at mark 94, this position is set as the home position of first robotic arm 74. First robotic arm 74 will then deposit wafers 48 on the transfer arm at this spot each time a wafer 48 is transferred. The result is that each wafer 48 is placed on chuck 16 in the same centered position.

FIG. 12 illustrates another embodiment of this aspect of the present invention. A transfer arm is shown at 150, including two prongs 152 and 154, vacuum holes 156 and a marking member 158. Marking member 158 permits the position of centering tool 10 to be marked on transfer arm 150 without using a pen or pencil to make the mark. In one embodiment, marking member 158 includes a curved end 160 adjacent the end of the transfer arm that holds substrates. Curved end 160 has the same curvature as the substrate to be transferred. In this embodiment, marking member 158 is slidably attached to transfer arm 150 in a conventional manner by bolts 162 extending through marking member 158 and into slots 164 formed in transfer arm 150.

The use of marking member 158 is illustrated in FIG. 13. Centering tool 10 is first centered on chuck 16 using the above-described method. Next, marking member 158 is slid into contact with the edge of centering tool 10 so that curved edge 160 is fully in contact with centering tool 10. Bolts 162 are then tightened, securing marking member 158 in place on transfer arm 150. Transfer arm 150 may then be moved to second home position 86 according to FIG. 11, and first robotic arm 74 may then be set to its home position 82 by positioning wafer 48 against curved end 160 of marking member 158. This method of marking a transfer arm offers several advantages over the use of a marking device to mark the arm. For example, the use of marking member 158 on transfer arm 150 prevents the introduction of any contaminants into the processing environment, such as graphite dust from a pencil or solvent vapor from a pen, that may occur by making mark 94 on transfer arm 50 with marking device 92. Also, marking member 158 further facilitates the positioning of first robotic arm 74. When mark 94 is used for the adjusting process, first robotic arm 74 must be visually adjusted to position wafer 48 over mark 94. When marking member 158 is used, however, no visual estimation of the position of wafer 48 relative to marking member 158 needs to be made. Instead, first robotic arm may simply be adjusted to place wafer 48 against curved surface 160 of marking member 158. Thus, the chances of making errors in the adjustment process are reduced.

Figure 14:
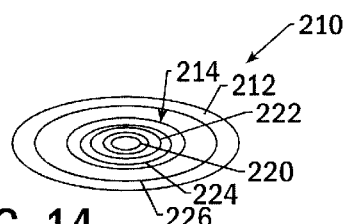
FIG. 14 is an isometric view of another embodiment of a centering tool according to the present invention.

In another aspect of the present invention, a centering tool may be used to center a substrate other than a semiconductor wafer, and may also be used to position a wafer on an apparatus in a desired, though non-centered, position. In FIG. 14, one embodiment of this aspect is illustrated. A centering tool is indicated generally at 210. Centering tool 210 is configured for centering a glass plate on a rotatable chuck in a wafer-processing machine. Centering tool 210 includes a plate 212 that is at least partially transparent so the position of the chuck relative to centering tool 210 can be determined by looking through plate 212. Centering tool 210 also includes a centering mark 214. Though any suitable mark may be used, a preferred mark is shown in FIG. 14 comprising three regions of concentric circles 220, 222 and 224. The circles are spaced the closest in inner region 220, and are typically formed 5 millimeters apart. Middle region 222 has more space, typically 10 millimeters, between adjacent circles, and outer region 224 has the widest spacing, typically 20 millimeters between circles. Centering mark 214 is used as a reference point for positioning centering tool 210 in a centered position on the rotatable vacuum chuck of the wafer-mounting machine. Centering tool 210 also includes an outer circle 226 that is spaced 8 millimeters from the edge of centering tool 210. This distance represents the minimum distance from the edge of a polishing plate at which wafers should be mounted. The design considerations for centering tool 210 are similar to those of centering tool 10. For example, some portion of centering tool 210 must dimensionally correspond to the radius of the glass plate so that a glass plate centering system can be adjusted to the correct centering position. In a preferred embodiment, centering tool 210 is a circular plate. Glass polishing plates typically have a radius of 245–282.5 millimeters, so centering tool 210 should be sized accordingly. Also, though any transparent material may be chosen to make at least a portion of centering tool 210 transparent, a lightweight, durable, heat-resistant and shock-resistant material is preferred for the overall construction of centering tool 210. Polycarbonate plastic is a preferred material.

Figure 15:
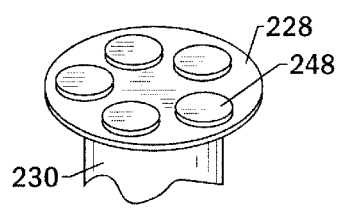
FIG. 15 is an isometric view of a glass polishing plate with semiconductor wafers mounted on the plate.

The use of a glass plate for mounting semiconductor wafers for a polishing process is illustrated in FIG. 15. A glass plate is indicated at 228, onto which approximately 5–7 semiconductor wafers 248 may be mounted. Glass plate 228 is then mounted on a base 230 beneath a polishing pad (not shown), such that all wafers 248 mounted to glass plate 228 are polished at the same time. For the polishing process to be performed successfully, all wafers should be mounted at the correct location on the glass plate. If some wafers are mounted closer to the center of glass plate 228 than other wafers, they may be polished at a slower rate than the other wafers, and may not be adequately processed as a result. Furthermore, because glass plate 228 may have some curvature within 8 millimeters of its edge, wafers 248 should not be mounted any closer than this distance to the plate edge to prevent possible damage to wafers 248. Thus, it is important that glass plate 228 is correctly centered on a wafer-mounting machine before any wafers 248 are mounted.

Figure 16:
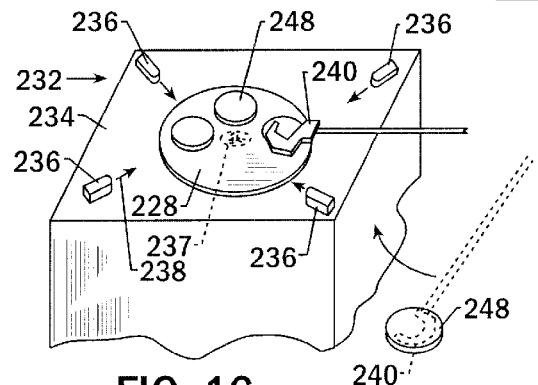
FIG. 16 is an isometric schematic view of the process of mounting a wafer onto a glass polishing plate on an automated wafer-mounting machine with a four-point centering system.
Figure 17:
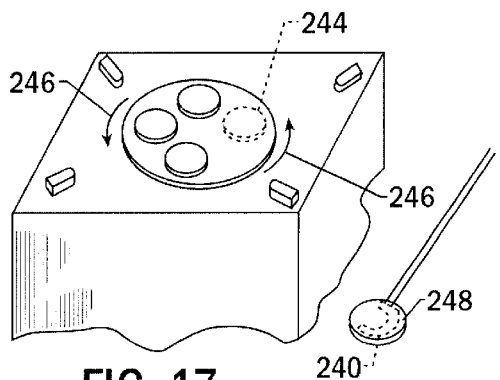
FIG. 17 is an isometric schematic view of the process of mounting another wafer onto the glass polishing plate of FIG. 16.

The use of centering tool 210 to center a glass plate on a wafer-mounting machine is illustrated in FIGS. 16–21. FIGS. 16–17 illustrate the operation of a wafer-mounting machine 232. Wafer mounting machine 232 includes a top 234, and a four-point substrate centering system for centering glass plate 228. The four-point centering system includes four rams 236 that move in unison inward toward glass plate 228, indicated by arrows 238, to push glass plate 228 into a centered position on a plate-turning mechanism 237 such as a rotatable vacuum chuck. In FIG. 16, glass plate 228 is shown with two wafers 248 already mounted to its surface. An inverter transfer arm 240 is shown transferring a third wafer from another processing machine, such as a wax spin-coat machine, to wafer-mounting machine 232. Inverter transfer arm 240 turns wafer 248 face down before mounting wafer 248 to glass plate 228. Inverter transfer arm 240 lowers wafer 248 onto glass plate 228, and glass plate 228 is then turned by plate-turning mechanism 237, indicated by arrows 246, to bring another wafer-mounting position 244 into place for mounting another wafer 248.

Figure 18:
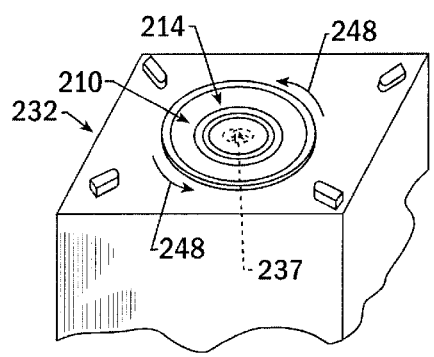
FIG. 18 is an isometric view of a centering tool according to another embodiment of the present invention centered on an automated wafer-mounting machine.
Figure 19:
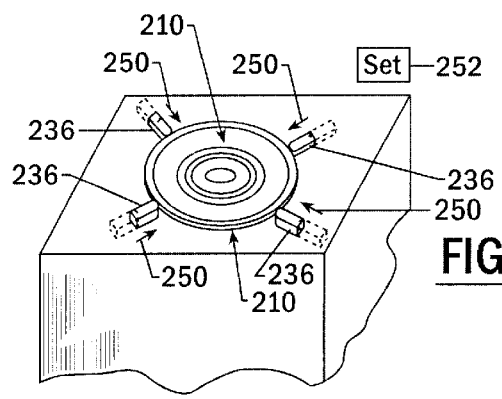
FIG. 19 is an isometric view of a four-point centering system in contact with the centering tool of FIG. 18.

The use of centering tool 210 to adjust centering rams 236 is illustrated in FIGS. 18–19. In FIG. 18, centering tool 210 is shown positioned on wafer-mounting machine 232. First, centering mark 214 is used to center centering tool 210 on plate-turning mechanism 237 by following the visual centering process described above. After centering tool 210 has been centered, plate-turning mechanism 237 is activated, indicated by arrows 248, to turn centering tool 210 to verify that centering tool 237 is centered. Next, the four centering rams 236 are moved into close proximity with centering tool 210, indicated by arrows 250, as shown in FIG. 19. Once in proximity with centering tool 210, rams 236 are carefully adjusted so that they contact centering tool 210, and are then set to return to this adjusted location each time a new glass plate is placed on wafer-mounting machine 232.

Figure 20:
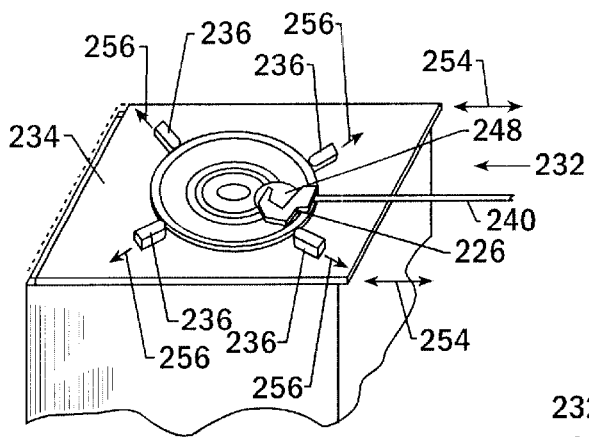
FIG. 20 is an isometric view of a wafer on a transfer arm positioned over the centering tool of FIG. 18.
Figure 21:
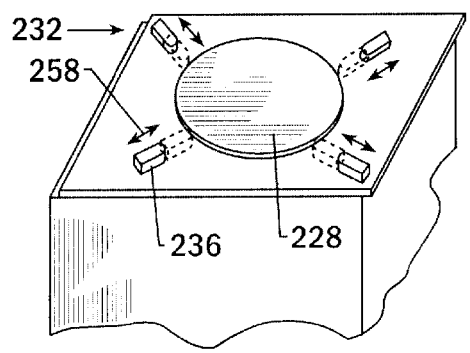
FIG. 21 is an isometric view of the process of a glass plate positioned on the automated wafer-mounting machine with the adjusted four-point centering system of FIG. 19.

After the four centering rams 236 have been adjusted using centering tool 210, centering tool 210 is used to adjust the position of top 234 of wafer-mounting machine 232 relative to the position of wafers 248 on transfer arm 240. FIG. 20 illustrates this process. Transfer arm 240 picks up wafers 248 from an earlier processing machine in a manner such that each wafer 248 is positioned at the same location on transfer arm 240. Once transfer arm 240 is positioned over glass plate 228, top 234 of wafer-mounting machine 232 can be moved relative to transfer arm 240, indicated by arrows 254, to position wafers 248 on a location inward on the glass plate from 8 millimeter circle 226. Once top 234 is correctly positioned relative to wafers 248 on transfer arm 240, the adjustment of wafer-mounting machine 232 is complete. Rams 236 may be moved outwards from centering tool 210, indicated by arrows 256, and centering tool 210 may be removed from wafer-mounting machine 232. Then, as shown in FIG. 21, a glass plate 228 that is placed on wafer-mounting machine 232 may be centered. Rams 236 may be activated to move first inwardly towards glass plate 238 to center glass plate 238, and then outwardly away from glass plate 238, as indicated by arrows 258.

Figure 22:
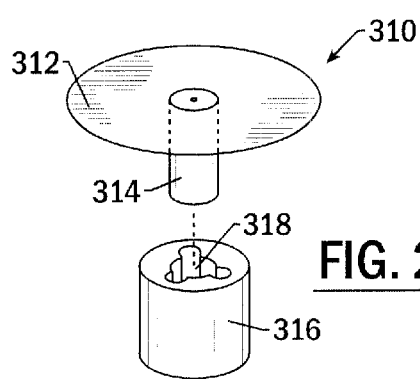
FIG. 22 is an isometric view of another embodiment of a centering tool according to the present invention.
Figure 23:
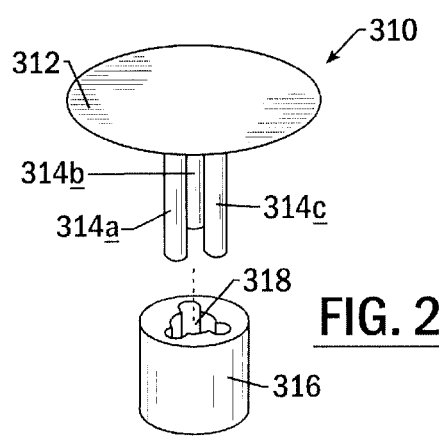
FIG. 23 is an isometric view of an alternate embodiment of the centering tool of FIG. 22.

Another embodiment of the present invention is depicted in FIGS. 22–23. A wafer centering tool, indicated generally at 310, includes an upper piece 312 and a downwardly-extending structure 314. Structure 314 is configured to fit within a vacuum port 318 on a rotatable vacuum chuck 316 in such a manner as to fix upper piece 312 in a centered position on chuck 316. Once fixed on chuck 316, upper piece 312 may then be used to adjust a substrate centering system in the same manner as the other embodiments described above.

Upper piece 312 may be made from any suitable material. Suitable materials include those that are inexpensive, durable, thermally and dimensionally stable, and easy to machine or mold. Polycarbonate plastic is an example of a preferred material. Because upper piece 312 is automatically centered on chuck 316 when structure 314 is placed in vacuum port 318, there is no need for upper piece 312 to have any lines scribed in its surface, or for upper piece 312 to be made of a transparent material. However, lines may be scribed on the surface if desired for a given purpose. For instance, a circle 8 millimeters from the edge of a centering tool 310 designed for use with glass polishing plates may be made on the surface of upper piece 312 for positioning wafers relative to the edge of a glass plate. However, at least some portion of upper piece 312 must dimensionally correspond to the radius of a substrate to be centered so that upper piece 312 may be used to adjust the substrate centering system to a correct centering position. Upper piece 312 may be an elongate member extending outwardly from structure 314 with the same length as the radius of a desired substrate. Upper piece 312 may also be formed as a wedge or semi-circle of the same radius and curvature as a desired substrate. In a preferred embodiment, upper piece 312 is a flat circular plate, as shown in FIG. 22.

Structure 314 may also be made from any suitable material. Structure 314 should be very smooth so that inserting structure 314 into vacuum port 318 does not damage vacuum port 318. Structure 314 should also be constructed of a material that is difficult to damage, as any material scratched off of structure 314 when it is inserted in vacuum port 318 may contaminate the processing environment. Also, damage to structure 314 may change the shape of structure 314 sufficiently to degrade the accurate performance of centering tool 310. Thus, structure 314 should be made from a hard material that can be easily formed into pieces with a smooth finish.

The shape of structure 314 may be chosen to any suitable shape for a given vacuum chuck 316 and vacuum port 318. For example, where vacuum port 318 is a circular opening, structure 314 may be a single rod of the same diameter as vacuum port 318. Alternatively, structure 314 may be two or more smaller rods for contacting the inner surface of vacuum port 318 at two or more locations, as shown by the three-rod structure 314a, 314b and 314c in FIG. 23. Structure 314 may also be any length desired, but is preferably only a few inches long or less to minimize the potential of causing any damage to vacuum port 318 when structure 314 is inserted into vacuum port 318.

INDUSTRIAL APPLICABILITY

This invention is applicable to substrate centering tools and methods, and is particularly applicable to centering semiconductor substrates on semiconductor processing apparatuses.

While the invention has been disclosed in its preferred form, the specific embodiments thereof as disclosed and illustrated herein are not to be considered in a limiting sense as numerous variations are possible. Applicants regard the subject matter of their invention to include all novel and non-obvious combinations and subcombinations of the various elements, features, functions and/or properties disclosed herein. No single feature, function, element or property of the disclosed embodiments is essential to all embodiments. The following claims define certain combinations and subcombinations which are regarded as novel and non-obvious. Other combinations and subcombinations of features, functions, elements and/or properties may be claimed through amendment of the present claims or presentation of new claims in this or a related application. Such claims, whether they are different, broader, narrower or equal in scope to the original claims, are also regarded as included within the subject matter of applicants' invention.

We claim:

1. An apparatus for use in adjusting a substrate centering system to center a substrate on a rotatable chuck in a semiconductor processing machine, the chuck including at least one reference point, the apparatus comprising a plate configured to be placed on the chuck; and at least one centering mark formed on the plate; wherein the at least one centering mark is configured so that it may be compared to the at least one reference point on the chuck to determine if the plate is centered, said plate further configured to be removed from the chuck following adjustment of the substrate centering system and prior to operation of the semiconductor processing machine.

2. The apparatus of claim 1, wherein the plate is at least partially transparent so that its position relative to the at least one reference point on the chuck may be seen.

3. The apparatus of claim 1, wherein the plate is made of a plastic material.

4. The apparatus of claim 3, wherein the plastic material is polycarbonate plastic.

5. The apparatus of claim 1, wherein the plate has the same radial dimensions as the substrate to be centered.

6. The apparatus of claim 1, wherein the centering mark is a circle formed around the center of the plate.

7. The apparatus of claim 1, wherein the at least one centering mark comprises a plurality of concentric circles formed around the center of the plate.

8. The apparatus of claim 1, wherein the chuck includes an outside edge and wherein the centering mark is a line configured to be the same shape as the outside edge of the chuck.

9. A method of adjusting a substrate centering system to center a substrate on a rotatable chuck in a semiconductor wafer processing machine, the chuck including at least one reference point, the method comprising:

providing an at least partially transparent centering tool to be centered on the chuck, wherein the centering tool includes at least one centering mark;

placing the centering tool on the chuck;

comparing the at least one reference point on the chuck to the at least one centering mark on the centering tool;

moving the centering tool to position the at least one centering mark in a predetermined position relative to the at least one reference point on the chuck so that the centering tool is centered on the chuck; and using the centering tool to adjust the substrate centering system to center a substrate on the chuck.

10. The method of claim 9, wherein providing an at least partially transparent centering tool with at least one centering mark includes providing an at least partially transparent centering plate with at least one centering mark.

11. The method of claim 9, wherein providing an at least partially transparent centering tool with at least one centering mark includes providing an at least partially transparent centering tool with at least one circle to compare to the at least one reference point on the chuck.

12. The method of claim 9, wherein providing an at least partially transparent centering tool with at least one centering mark includes providing an at least partially transparent centering tool with a plurality of concentric circles.

13. The method of claim 9, wherein placing the centering tool on the chuck includes placing the centering tool on the chuck so that the at least one reference point on the chuck is visible through the at least partially transparent centering tool.

14. The method of claim 9, wherein using the centering tool to adjust the substrate centering system to center a substrate on the chuck includes using the centering tool to adjust a two-plate centering mechanism to center a substrate by positioning the two-plate centering mechanism in a centering position adjacent the centering tool and fixing the two-plate centering mechanism to return to the centering position when a substrate is placed on the chuck.

15. The method of claim 9, wherein using the centering tool to adjust the substrate centering system to center a substrate on the chuck includes using the centering tool to adjust a four-point centering mechanism to center a substrate by positioning the four point mechanism to a centering position adjacent the centering tool and fixing the four-point centering mechanism to return to the centering position when a substrate is placed on the chuck.

16. The method of claim 9, wherein using the centering tool to adjust the substrate centering system to center a substrate on the chuck includes using the centering tool to adjust a first robotic arm to place a wafer on the chuck in a centered position by moving the first robotic arm to a first home position adjacent the centering tool, marking the position of the centering tool on the first robotic arm, moving the first robotic arm to a second home position adjacent a second robotic arm, and setting the second robotic arm to place a wafer on the marked position on the first robotic arm.

* * * * *